United States Patent [19]

Green et al.

[11] Patent Number: 4,965,799
[45] Date of Patent: Oct. 23, 1990

[54] METHOD AND APPARATUS FOR TESTING INTEGRATED CIRCUIT MEMORIES

[75] Inventors: George D. Green, College Park; William C. Mullauer, Baltimore, both of Md.

[73] Assignee: Microcomputer Doctors, Inc., College Park, Md.

[21] Appl. No.: 228,687

[22] Filed: Aug. 5, 1988

[51] Int. Cl.$^5$ ............................................. G06F 11/00
[52] U.S. Cl. .................................. 371/21.2; 371/21.3; 371/27
[58] Field of Search ................... 371/21.2, 21.3, 21.4, 371/21.1, 24, 27, 25.1; 365/201, 233

[56] References Cited

U.S. PATENT DOCUMENTS

| | | | |
|---|---|---|---|
| 3,633,174 | 1/1972 | Griffin | 371/21.3 |
| 4,195,770 | 4/1980 | Benton et al. | 371/21 |
| 4,369,511 | 1/1983 | Kimura et al. | 371/21 |
| 4,402,081 | 8/1983 | Ichimiya et al. | 371/21 |
| 4,423,380 | 12/1983 | Pileri | 324/73 R |
| 4,429,389 | 1/1984 | Catiller | 371/27 X |
| 4,450,560 | 5/1984 | Conner | 371/21.1 X |
| 4,468,759 | 7/1984 | Kung et al. | 365/201 |
| 4,553,225 | 11/1985 | Ohe | 365/201 |
| 4,661,930 | 4/1987 | Tran | 365/201 |
| 4,672,583 | 6/1987 | Nakaizumi | 371/21.2 X |
| 4,686,456 | 8/1987 | Furuyama et al. | 324/73 R |
| 4,715,034 | 12/1987 | Jacobson | 371/21.1 X |
| 4,730,318 | 3/1988 | Bogholtz | 371/21.1 X |
| 4,783,785 | 11/1988 | Hanta | 371/21.2 |

Primary Examiner—Jerry Smith
Assistant Examiner—Robert W. Beausoliel

[57] ABSTRACT

A method and apparatus for testing the functionality and maximum operating speed of a dynamic random access memory (DRAM) chip includes a random sequencer circuit for generating a pseudo-random data bit pattern to be written into the cells of a DRAM chip. The apparatus includes a variable clock circuit which produces a continuously variable frequency clock signal to continuously increase the speed at which data is written into the DRAM. During read cycles of the DRAM, data read from the DRAM is compared with the pattern produced by the random sequencer in a comparator, and any non-correspondence between bits will activate an LED to indicate a failure of the chip. In this way, the maximum speed of the chip may be determined to isolate both defective and marginally damaged chips. The apparatus is operated as a stand-alone unit which does not require the use of any software or interfaced host microprocessor.

16 Claims, 1 Drawing Sheet

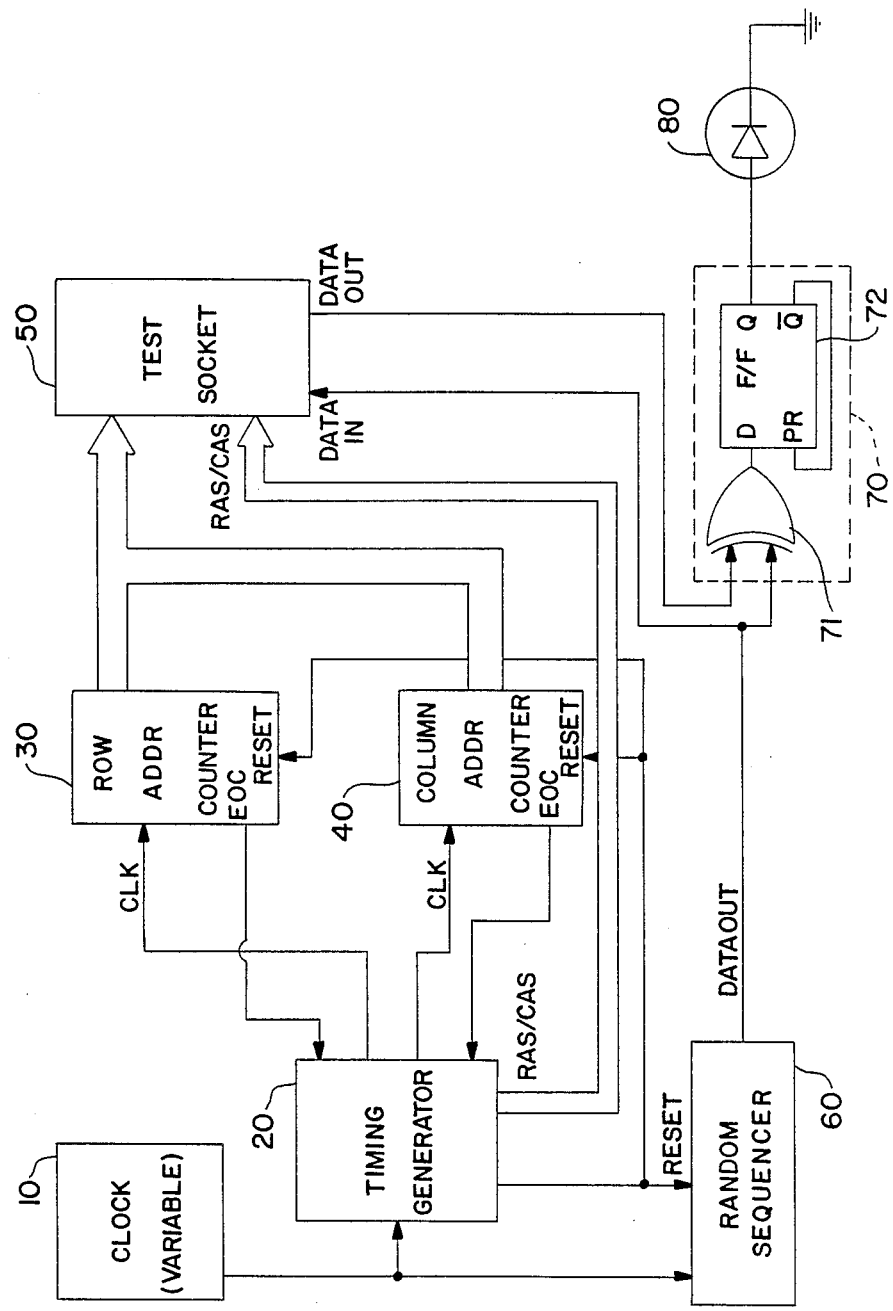

METHOD AND APPARATUS FOR TESTING INTEGRATED CIRCUIT MEMORIES

BACKGROUND OF THE INVENTION

This invention relates generally to circuits for testing integrated circuit memories and more specifically relates to a method and apparatus for testing a dynamic random access memory (DRAM).

DESCRIPTION OF THE PRIOR ART

DRAM chips conventionally have been a service problem for computer technicians because of the way in which a DRAM stores data. The DRAM is composed of an array of small capacitors which hold a charge equivalent to a bit of information. Since the capacitors exhibit leakage, the DRAM must be constantly refreshed in order to function properly.

Conventional DRAM testers which are microprocessor based are known which test DRAM chips at discrete speeds to determine if the chips are good. Complex testing procedures are performed by these testers to test the actual structure of the DRAM chip. However, in these system based diagnostics testers, the speed at which the chips are tested cannot be changed.

Because of fabrication method limitations, not all RAM chips operate at the rated speed for which they are marked. Specifically, when chips are manufactured, the fastest chips are towards the center of the die because the focus of the pattern alignment is better at the center of the mask to thereby produce faster chips. As a result, some chips marked at a certain rated speed are able to run at faster speeds while others fail at speeds just slightly faster than the rated speed. Determining the speed of a DRAM is important since chips of different speeds should not be used together in a single PC since any difference in timing could cause parity or intermittent errors. Since the conventional microprocessor based diagnostic testers cannot adjust the speed of the test equipment, the use of such testers does not always uncover marginal DRAM chips which may work properly at rated speed but eventually fail depending upon cumulative operating time and temperature conditions.

SUMMARY OF THE INVENTION

It is thus an object of the present invention to overcome the problems with conventional DRAM testers as discussed above.

It is a further object of the present invention to provide a DRAM test apparatus which does not require the use of a microprocessor and which can operate as a stand-alone unit.

It is a still further object of the present invention to provide a DRAM chip test apparatus which is able to determine the maximum speed at which a DRAM is operable by continuously varying the access speed over a predetermined range.

The objects of the present invention are fulfilled by providing an apparatus for testing a DRAM comprising means for generating pseudo-random data bit patterns, means for addressing the memory cells of the DRAM, timing generator means for generating timing signals used to address the cells of the DRAM, a variable clock for producing a variable clock signal used in the generation of the timing signals and the generation of the pseudo-random data bit patterns, means for writing the pseudo-random data bit patterns into the memory cells of a DRAM during a write cycle, means for reading data bit patterns stored in the DRAM during a read cycle, and means for comparing data bit patterns read from the DRAM with data bit patterns generated by the means for generating and outputting a signal indicative of a non-correspondence between any two bits.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF DRAWINGS

The present invention will become more fully understood from the detailed description given hereinbelow and the accompanying drawings which are given by way of illustration only, and thus are not limitative of the present invention, and wherein:

The single drawing FIGURE is a schematic block diagram of a preferred embodiment of the present invention.

DETAILED DESCRIPTION OF THE PREFERRED EMBODIMENTS

The FIGURE is a block diagram illustrating a preferred embodiment of the dynamic RAM chip test apparatus of the present invention. A variable clock 10 sets the operational speed of the apparatus by providing a variable clock signal to a timing generator 20 which generates row access strobe (RAS), column access strobe (CAS) and sequencing signals to a test socket 50 into which a chip to be tested is inserted, and to row and column address counters 30 and 40 respectively. The test socket is a commercially available component such as described in U.S. Pat. No. 3,763,459. The clock 10 also provides a clock signal to random sequencer 60, which generates unique pseudo-random data bit patterns to be written into the DRAM under test. A comparator 70 is provided which consists of a D flip-flop 72 and an exclusive OR gate 71 to compare bit patterns read from the DRAM with the pattern generated by the random sequencer to determine correspondence between bits. A failure of the DRAM is indicated by the activation of an LED 80.

The pseudo-random bit pattern generated by the random sequencer 60 is generated to be longer than required for the largest DRAM which may be tested, currently 1 MEG. The test produced by the random sequencer 60 is a BERT test (bit error rate testing) which is used by the communications industry on Modems, communications lines and phone lines for determining frequency of errors. The timing generator develops clock signals for the row and column address counters 30 and 40 which successively address the memory cells of the DRAM in the test socket 50. The row and column address counters can be adjusted to produce address signals for DRAM chips of various capacity such as 64K, 128K, 256K and 1 MEG. At the end of the address count, the row and column counters send end of count (EOC) signals to the timing generator 20 which then sends a reset signal to the address counters and the random sequencer 60.

During the write cycle a pseudo-random data pattern is written into the DRAM from the random sequencer.

During a read cycle, the data in the DRAM is compared to the same pattern generated by the random sequencer 60 by the synchronous comparator 70. A non-correspondence between any two bits will latch the LED 80 to indicate a failure of the chip.

The data output by the random sequencer is inverted every other read/write cycle to test each bit in the DRAM in both high and low states.

The variable clock control allows the user to adjust the speed at which the DRAM is tested to determine the maximum or minimum speed at which the DRAM will operate properly.

Thus, by comparing the operational speeds of a bank of chips, for example 9 chips, any marginal or defective chips can be isolated. The test timing is 1/6 second per pass so that a full test can be performed 16 times per second in a 64K mode of the apparatus.

The invention being thus described, it will be obvious that the same may be varied in many ways. Such variations are not be regarded as a departure from the spirit and scope of the invention, and all such modifications as would be obvious to one skilled in the art are intended to be included within the scope of the following claims.

What is claimed is:

1. An apparatus for testing a dynamic random access memory (DRAM), comprising:
    data generating means for generating pseudo-random data bit patterns;
    address means for addressing memory cells of the DRAM by producing address signals;
    timing generator means for generating timing signals used by the DRAM and for generating timing signals used by said addressing means;
    variable clock means, operatively connected to said timing generating means, for producing a variable clock signal to be used by said timing generator means in the generation of said timing signals and to be used by said data generating means in the generation of said pseudo-random data bit patterns;
    write means, operatively connected to said data generating means, for writing said pseudo-random data bit patterns into the memory cells of the DRAM in response to said address signals and said timing signals used by the DRAM during a write cycle;
    read means for reading said pseudo-random data bit patterns stored in the DRAM in response to said address signals and said timing signals used by the DRAM during a read cycle; and
    comparing means, operatively connected to said read means, for comparing said pseudo-random data bit patterns read from the DRAM with said pseudo-random data bit patterns generated by said data generating means and for outputting a signal indicative of a non-correspondence between any two bits.

2. An apparatus as claimed in claim 1, further comprising:
    varying means for varying the frequency of said variable clock signal to increase the speed at which bit patterns are written into said memory cells to determine the maximum speed of the DRAM.

3. An apparatus as claimed in claim 1, wherein said data generating means inverts said pseudo-random data bit pattern every other write/read cycle.

4. The apparatus as claimed in claim 3 wherein said read/write cycle is a cycle representing all read/write operations needed to test every memory cell in the DRAM once.

5. An apparatus as claimed in claim 1, wherein said data generating means generates the same bit pattern for each part of a particular write/read cycle.

6. An apparatus as claimed in claim 1, further comprising:
    display means, responsive to said signal outputted by said comparing means, for indicating a failure of the DRAM.

7. The apparatus as claimed in claim 1 wherein said data generating provides a portion of said pseudo-random data bit pattern to said write means in response to said variable clock signals.

8. The apparatus as claimed in claim 1 wherein said address means comprises:
    row address counter means for providing a row address to be used in the addressing of the DRAM; and
    column address counter means for providing a column address to be used in the addressing of the DRAM;
    said timing generator means controlling said row address counter means and said column address counter means such that said row address counter means is fully incremented before said column address counter means is incremented.

9. A method of testing a dynamic random access memory (DRAM), comprising the steps of:
    (a) generating pseudo-random data bit patterns;
    (b) addressing memory cells of a DRAM;
    (c) generating timing signals used by the DRAM and timing signals used in the addressing of the DRAM;
    (d) producing a variable clock signal used in the generating of the timing signals and the generating of the pseudo-random data bit patterns;
    (e) writing the pseudo-random data bit patterns into the memory cells of the DRAM in conjunction with the addressing thereof and the timing signals;
    (f) reading the pseudo-random data bit patterns stored in the DRAM in conjunction with the addressing thereof and the timing signals;
    (g) comparing data bit patterns read from the DRAM with the pseudo-random data bit patterns generated in said step (a); and
    (h) indicating a non-correspondence between any two bits as a failure of the DRAM.

10. The method as claimed in claim 9, further comprising the step of:
    (i) continuously varying the frequency of the clock signal to determine the maximum speed of the DRAM.

11. The method as claimed in claim 9 wherein said step (b) comprises the steps of:
    (i) providing a row address for addressing the memory cells of the DRAM;
    (j) providing a column address for addressing the memory cells of the DRAM;
    (k) incrementing the provided row address of said step (i) to produce a next row address for addressing the memory cells of the DRAM;
    (l) repeating said step (k) until all row addresses have been provided;
    (m) incrementing the provided column address of said step (j) to produce a next column address for addressing the memory cells of the DRAM when the execution of said step (l) is completed; and
    (n) repeating said steps (i), (j), (k), (l) and (m) until all memory cells are addressed.

12. A method of testing a dynamic random access memory (DRAM), comprising the steps of:
   (a) generating a single pseudo-random data bit pattern which bit length is greater than a total bit capacity of a DRAM;
   (b) addressing memory cells of the DRAM;
   (c) generating timing signals to be used in addressing the DRAM;
   (d) producing a variable clock signal to be used in generating the timing signals and to be used in providing a portion of the pseudo-random data bit pattern;
   (e) writing the portion of the pseudo-random data bit pattern provided in said step (d) into a memory cell of the DRAM according to the addressing of the DRAM and the timing signals;
   (f) reading the portion written in said step (e) from the DRAM according to the addressing of the DRAM and the timing signals;
   (g) comparing the portion read from the DRAM in said step (f) with the portion of the pseudo-random data bit pattern provided for writing in said step (d);
   (h) indicating a failure of the DRAM when a non-correspondence is determined during the comparison executed in said step (g); and
   (i) repeating said steps (b), (c), (d), (e), (f), and (g) until said step (h) indicates a failure or until all memory cells of the DRAM are tested.

13. The method as claimed in claim 12, further comprising the steps of:
   (j) generating a pseudo-random data bit pattern which is an inverse of the pattern generated in said step (a) when all memory cells of the DRAM have been tested; and
   (k) repeating said steps (b), (c), (d), (e), (f), and (g) using the pattern generated in said step (j) until said step (h) indicates a failure or all memory cells of the DRAM have been tested with the pattern generated in said step (j).

14. The method as claimed in claim 13, wherein said step (d) comprises the step of:
   (l) continuously varying the frequency of the clock signal to determine the maximum speed of the DRAM.

15. The method as claimed in claim 12, wherein said step (d) comprises the step of:
   (j) continuously varying the frequency of the clock signals to determine the maximum speed of the DRAM.

16. The method as claimed in claim 12 wherein said step (b) comprises the steps of:
   (j) providing a row address for addressing the memory cells of the DRAM;
   (k) providing a column address for addressing the memory cells of the DRAM;
   (l) incrementing the provided row address of said step (j) to produce a next row address for addressing the memory cells of the DRAM;
   (m) repeating said step (l) until all row addresses have been provided;
   (n) incrementing the provided column address of said step (k) to produce a next column address for addressing the memory cells of the DRAM when the execution of said step (m) is completed; and
   (o) repeating said steps (j), (k), (l), (m) and (n) until all memory cells are addressed.

* * * * *